US012616071B2

(12) United States Patent
Murugan et al.

(10) Patent No.: US 12,616,071 B2
(45) Date of Patent: Apr. 28, 2026

(54) METHOD FORMING A MICRO LED DISPLAY DEVICE

(71) Applicant: PlayNitride Display Co., Ltd., Zhunan Township, Miaoli County (TW)

(72) Inventors: Loganathan Murugan, Zhunan Township (TW); Sheng-Yuan Sun, Zhunan Township (TW); Po-Wei Chiu, Zhunan Township (TW)

(73) Assignee: PLAYNITRIDE DISPLAY CO., LTD., Zhunan Township, Miaoli County (TW)

( * ) Notice: Subject to any disclaimer, the term of this patent is extended or adjusted under 35 U.S.C. 154(b) by 378 days.

(21) Appl. No.: 18/523,167

(22) Filed: Nov. 29, 2023

(65) Prior Publication Data

US 2024/0096856 A1 Mar. 21, 2024

Related U.S. Application Data

(62) Division of application No. 17/512,863, filed on Oct. 28, 2021, now Pat. No. 11,973,068.

(51) Int. Cl.
H10W 90/00 (2026.01)
H10H 20/01 (2025.01)
(Continued)

(52) U.S. Cl.
CPC .......... *H10W 90/00* (2026.01); *H10H 20/856* (2025.01); *H10H 20/0361* (2025.01); *H10H 20/0363* (2025.01); *H10H 20/851* (2025.01)

(58) Field of Classification Search
None
See application file for complete search history.

(56) References Cited

U.S. PATENT DOCUMENTS 10,048,427 B2 8/2018 Aoyagi et al.
10,312,228 B2 6/2019 Chen et al.
(Continued)

FOREIGN PATENT DOCUMENTS

CN 111081685 A 4/2020
CN 112640114 A 4/2021
(Continued)

OTHER PUBLICATIONS

Taiwanese Office Action and Search Report for Taiwanese Application No. 110140147, dated Nov. 28, 2022.
(Continued)

*Primary Examiner* — Alexander G Ghyka
(74) *Attorney, Agent, or Firm* — Birch, Stewart, Kolasch & Birch, LLP

(57) ABSTRACT

A micro LED display device includes: a substrate; a plurality of micro light-emitting diodes disposed on the substrate; and a reflective layer and a black layer sequentially stacked on the substrate. The reflective layer and the black layer cover a surface of the substrate, wherein a top surface of the plurality of micro light-emitting diodes is exposed through the reflective layer and the black layer. A plurality of reflective banks and a plurality of black banks are sequentially disposed on the black layer and exposing the plurality of micro light-emitting diodes; and a color-conversion material covers the top surface of at least one of the plurality of micro light-emitting diodes. The color-conversion material is laterally disposed between the plurality of reflective banks. The reflective layer, the black layer, the plurality of reflective banks, and the plurality of black banks overlap each other in a display direction.

18 Claims, 9 Drawing Sheets

(51) Int. Cl.
  *H10H 20/851* (2025.01)
  *H10H 20/856* (2025.01)

(56) References Cited

U.S. PATENT DOCUMENTS

| | | | |
|---|---|---|---|
| 10,580,843 B2 | 3/2020 | Zhao et al. | |
| 11,118,757 B2 | 9/2021 | Yamada et al. | |
| 11,329,199 B2 | 5/2022 | Gootz et al. | |
| 2003/0146695 A1 | 8/2003 | Seki | |
| 2015/0171327 A1 | 6/2015 | Matsushima | |
| 2018/0151543 A1 | 5/2018 | Lee | |
| 2018/0210280 A1 | 7/2018 | Chen et al. | |
| 2019/0096774 A1* | 3/2019 | Chaji | H01L 21/6835 |
| 2019/0295996 A1 | 9/2019 | Park et al. | |
| 2019/0371868 A1* | 12/2019 | Chaji | H01L 21/6835 |
| 2020/0135799 A1 | 4/2020 | Chen et al. | |
| 2020/0152612 A1 | 5/2020 | Chen et al. | |
| 2020/0373359 A1 | 11/2020 | Lee et al. | |
| 2020/0411490 A1* | 12/2020 | Ahmed | H01L 25/167 |
| 2021/0050495 A1 | 2/2021 | Yang et al. | |
| 2021/0185776 A1 | 6/2021 | Lin et al. | |
| 2021/0336224 A1* | 10/2021 | Yun | H10K 59/8731 |
| 2021/0341653 A1* | 11/2021 | Wang | H10H 29/142 |
| 2021/0367113 A1 | 11/2021 | Lin et al. | |
| 2022/0190200 A1* | 6/2022 | Yu | H10H 20/819 |
| 2022/0199920 A1* | 6/2022 | Kim | H10K 59/352 |
| 2022/0216276 A1* | 7/2022 | Lee | H10K 59/131 |
| 2022/0328715 A1* | 10/2022 | Chaji | H01L 25/167 |
| 2022/0367766 A1* | 11/2022 | Her | H01L 25/0753 |
| 2023/0135465 A1 | 5/2023 | Murugan et al. | |

FOREIGN PATENT DOCUMENTS

| | | |
|---|---|---|
| CN | 113380842 A | 9/2021 |
| JP | 2015-128027 A | 7/2015 |
| TW | 202018931 A | 5/2020 |
| TW | 1707491 B | 10/2020 |
| TW | 202123503 A | 6/2021 |
| TW | 202125848 A | 7/2021 |
| WO | WO 2020/115851 A1 | 6/2020 |

OTHER PUBLICATIONS

Chinese Office Action and Search Report for Chinese Application No. 202111279519.4, dated Apr. 17, 2024.

* cited by examiner

20

20'

METHOD FORMING A MICRO LED DISPLAY DEVICE

CROSS REFERENCE TO RELATED APPLICATIONS

This application is a Divisional of Ser. No. 17/512,863, filed Oct. 28, 2021, and entitled "MIRCO LED DISPLAY AND METHOD FORMIN THE SAME", the entirety of which is incorporated by reference herein.

BACKGROUND

Technical Field

The present disclosure is related to a micro light-emitting diode (ILED) display device, and in particular it is related to a configuration of a reflective structure and a black structure of the micro light-emitting diode display device and a method forming the same.

Description of the Related Art

As optoelectronic technology advances, the feature size of an optoelectronic device continues to reduce. In comparison with organic light emitting diode (OLED), micro light-emitting diode (ILED) has several advantages, such as higher efficiency, longer lifetime, relatively stable materials that are insensitive to environmental influences, and capability of providing images with higher resolution. Therefore, a display device manufactured with micro light-emitting diodes arranged in an array has gradually gained importance in the market.

Color-conversion materials are quantum dots (QD) that consist of semiconductor particles of II-VI or III-V group elements. The emitting light color of the color-conversion materials may be adjusted through the dimension, structure, or composition of the color-conversion material, in order to achieve higher color-conversion efficiency. While the characteristics of the color-conversion materials play a crucial role to the overall performance, a plurality of bank structures separating the color-conversion materials of different colors may also affect the display device in operation. Under turn-off state, the ambient light may reflect at the reflective layer, which will decrease the display quality, for example the contrast ratio of the displayed image. These related issues need to be addressed.

SUMMARY

In an embodiment, a micro LED display device includes: a substrate; a plurality of micro light-emitting diodes disposed on the substrate; a reflective layer and a black layer sequentially stacked on the substrate, the reflective layer and the black layer cover a surface of the substrate, wherein a top surface of each micro light-emitting diode is exposed through the reflective layer and the black layer, and a sidewall of each micro light-emitting diode is covered by the reflective layer and the black layer; a plurality of reflective banks and a plurality of black banks sequentially disposed on the black layer and exposing the top surface of the plurality of micro light-emitting diodes, wherein the reflective layer, the black layer, the plurality of reflective banks, and the plurality of black banks overlap each other in a display direction; and a color-conversion material covering the top surface of at least one of the plurality of micro light-emitting diodes, wherein the color-conversion material is laterally disposed between the plurality of reflective banks.

In another embodiment, a method forming a micro LED display device, includes: providing a substrate; bonding a plurality of micro light-emitting diodes on the substrate by a mass transfer process; forming a first reflective layer on the substrate, wherein the first reflective layer covers the substrate and a sidewall of each micro light-emitting diode; forming a first black layer to cover the first reflective layer and the plurality of micro light-emitting diodes; etching back the first black layer until a top surface of each micro light-emitting diode is exposed through the first black layer; forming a second reflective layer and a second black layer on the plurality of micro light-emitting diodes and the first black layer; patterning the second reflective layer and the second black layer into a plurality of reflective banks and a plurality of black banks, respectively; and filling a color-conversion material laterally between the plurality of reflective banks, wherein the color-conversion material covers the top surface of at least one of the plurality of micro light-emitting diodes.

BRIEF DESCRIPTION OF THE DRAWINGS

The disclosure can be more fully understood from the following detailed description when read with the accompanying figures. It is worth noting that, in accordance with standard practice in the industry, various features are not drawn to scale. In fact, the dimensions of the various features may be arbitrarily increased or reduced for clarity of discussion.

DETAILED DESCRIPTION

Figure 1:
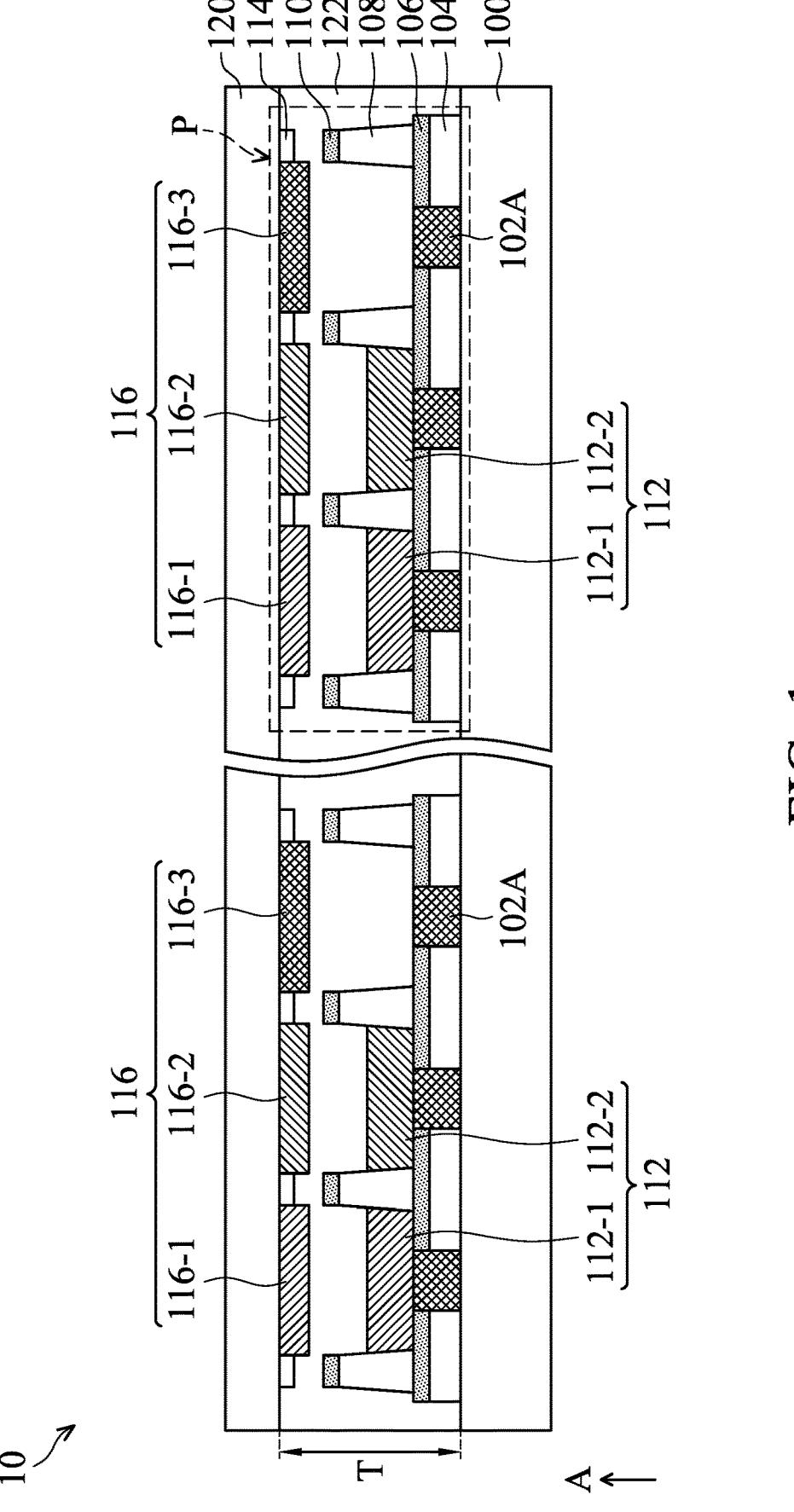
FIG. 1 is a cross-sectional view of a display device, according to some embodiments of the present disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, a first feature is formed on a second feature in the description that follows may include embodiments in which the first feature and second feature are formed in direct contact, and may also include embodiments in which additional features may be formed between the first feature and second feature, so that the first feature and second feature may not be in direct contact.

It should be understood that additional steps may be implemented before, during, or after the illustrated methods, and some steps might be replaced or omitted in other embodiments of the illustrated methods.

Furthermore, spatially relative terms, such as "beneath," "below," "lower," "on," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, the terms "about," "approximately" and "substantially" typically mean ±20% of the stated value, more typically ±10% of the stated value, more typically ±5% of the stated value, more typically ±3% of the stated value, more typically ±2% of the stated value, more typically ±1% of the stated value and even more typically ±0.5% of the stated value. The stated value of the present disclosure is an approximate value. That is, when there is no specific description of the terms "about," "approximately" and "substantially", the stated value includes the meaning of "about," "approximately" or "substantially".

Unless otherwise defined, all terms (including technical and scientific terms) used herein have the same meaning as commonly understood by one of ordinary skill in the art to which this disclosure belongs. It should be understood that terms such as those defined in commonly used dictionaries should be interpreted as having a meaning that is consistent with their meaning in the context of the prior art and will not be interpreted in an idealized or overly formal sense unless expressly so defined in the embodiments of the present disclosure.

The present disclosure may repeat reference numerals and/or letters in following embodiments. This repetition is for the purpose of simplicity and clarity and does not in itself dictate a relationship between the various embodiments and/or configurations discussed.

The quality of an image resulted from a display device may be compromised when the contrast ratio is reduced or when the blackness is insufficient. In order to increase contrast ratio and/or blackness, ambient light reflection must be suppressed. A conventional structure of the display device implements a single reflective layer and a plurality of black banks. The reflective layer surrounds each of a plurality of micro light-emitting diodes, while the plurality of black banks are disposed on the reflective layer and laterally between and exposing the plurality of micro light-emitting diodes. Even though the conventional configuration is simpler with lower cost, such configuration is inadequate to suppress ambient light reflection. For example, the plurality of black banks may absorb photons emitted from the plurality of micro light-emitting diodes, resulting in lower luminance. In other words, the configuration of the conventional display device may concurrently eliminate desired light rays and allow undesired light rays, hence degrading the overall quality of the resulting image displayed.

The present disclosure provides an innovative way to solve both the luminance issue and the ambient light reflection issue. According to some embodiments of the present disclosure, a black layer is added above the reflective layer to reduce ambient light reflection, and a plurality of reflective banks is added below the plurality of black banks to preserve the emitted photons. When the bank structure includes materials of reflective nature, the emitted photons may be more easily funneled toward a designated direction in order to improve luminance. Furthermore, capping the plurality of reflective banks with the plurality of black banks may more effectively absorb unwanted ambient light.

FIG. 1 is a cross-sectional view of a display device 10, according to some embodiments of the present disclosure. In some embodiments, display devices may contain millions of pixels in reality. For the sake of brevity, FIG. 1 only illustrates two exemplary pixels P of an actual display device. Each exemplary pixel P may include sub-pixel regions that are red, green, and blue (for example, from left to right, as shown in FIG. 1). According to some embodiments of the present disclosure, the display device 10 includes a substrate 100, a plurality of micro light-emitting diodes 102 (for example, blue micro light-emitting diodes 102A), a reflective layer 104, a black layer 106, a plurality of reflective banks 108, a plurality of black banks 110, color-conversion materials 112, a plurality of light-shielding structures 114, a plurality of color filter units 116, a cover plate 120, and an optical layer 122. In some embodiment, the plurality of micro light-emitting diodes 102 may also be near violet (in a wavelength between 365 nm and 405 nm), ultra violet, green, or the like. Moreover, the color-conversion materials 112 include a red color-conversion material 112-1 and a green color-conversion material 112-2. In some embodiments, the plurality of color filter units 116 include a red color filter unit 116-1, a green color filter unit 116-2, and a blue color filter unit 116-3.

According to some embodiments of the present disclosure, the red color-conversion material 112-1 and the green color-conversion material 112-2 may convert blue light emitted from their corresponding blue micro light-emitting diodes 102A underneath into red light and green light, respectively. The converted red light and the converted green light may then be directed through the red color filter unit 116-1 and the green color filter unit 116-2, respectively. Since the red light, the green light, and the blue light are all available in the structure shown, they may constitute the exemplary pixel P of the display device 10 and an array of pixels would display an image in a display direction A.

Referring to FIG. 1, the reflective layer 104, the black layer 106, the plurality of reflective banks 108, and the plurality of black banks 110 are sequentially stacked, so reflective elements and black elements are alternately arranged. For example, the black layer 106 is sandwiched between the reflective layer 104 and the plurality of reflective banks 108 in the display direction A, while the plurality of reflective banks 108 are sandwiched between the black layer 106 and the plurality of black banks 110 in the display direction A. In some embodiments, the reflective layer 104, the black layer 106, the plurality of reflective banks 108, and the plurality of black banks 110 overlap each other in the display direction A. When viewed from top, except for the top surface of the plurality of micro light-emitting diodes 102, the display device 10 may appear to be substantially covered with black material, which makes it more efficient for suppressing ambient light reflection.

In some embodiments, the substrate 100 may be, for example, a wafer or a chip, but the present disclosure is not limited thereto. In some embodiments, the substrate 100 may be a semiconductor substrate, for example, silicon substrate. Furthermore, in some embodiments, the semiconductor substrate may also be an elemental semiconductor including germanium, a compound semiconductor including gallium nitride (GaN), silicon carbide (SiC), gallium arsenide (GaAs), gallium phosphide (GaP), indium phosphide (InP), indium arsenide (InAs), and/or indium antimonide (InSb), an alloy semiconductor including silicon germanium (SiGe) alloy, or a combination thereof. In some embodiments, the substrate 100 may be a photoelectric conversion substrate, such as a silicon substrate or an organic photoelectric conversion layer.

In other embodiments, the substrate 100 may also be a semiconductor on insulator (SOI) substrate. The semiconductor on insulator substrate may include a base plate, a buried oxide layer disposed on the base plate, and a semiconductor layer disposed on the buried oxide layer. In some embodiments, the substrate 100 may be a glass substrate with a thin film transistor (TFT) array. Furthermore, the substrate 100 may be an N-type or a P-type conductive type.

In some embodiments, the substrate 100 may be a back-plane for the plurality of micro light-emitting diodes 102. The backplane may further include additional elements (not shown for simplicity), such as the thin film transistors (TFT), complementary metal-oxide semiconductor (CMOS), printed circuit board (PCB), driving components, suitable conductive features, the like, or combinations thereof. Conductive features may include, but not limited to, cobalt (Co), ruthenium (Ru), aluminum (Al), tungsten (W), copper (Cu), titanium (Ti), tantalum (Ta), silver (Ag), gold (Au), platinum (Pt), nickel (Ni), zinc (Zn), chromium (Cr), molybdenum (Mo), niobium (Nb), the like, combinations thereof, or the multiple layers thereof. These elements provide circuitry that connects to the plurality of micro light-emitting diodes 102.

Referring to FIG. 1, the plurality of micro light-emitting diodes 102 are disposed on the substrate 100. In some embodiments, the plurality of micro light-emitting diodes 102 are arranged in an array on the surface of the substrate 100. The plurality of micro light-emitting diodes 102 may each include an N-type semiconductor layer, a light-emitting layer, and a P-type semiconductor layer. The light-emitting layer may be disposed between the N-type semiconductor layer and the P-type semiconductor layer. The light emitted from each of the plurality of micro light-emitting diodes 102 is determined by the light-emitting layer. For example, the blue micro light-emitting diodes 102A shown in FIG. 1 may emit blue light. As mentioned previously, the light-emitting layers of other micro light-emitting diodes 102 may emit near violet light, ultra violet light, green light, the like, or combinations thereof.

The N-type/P-type semiconductor layers may include materials of II-VI group (for example, zinc selenide (ZnSe)) or III-V group (for example, gallium nitride (GaN), aluminum nitride (AlN), indium nitride (InN), indium gallium nitride (InGaN), aluminum gallium nitride (AlGaN), or aluminum indium gallium nitride (AlInGaN)). Moreover, the semiconductor layers may include dopants (such as silicon or germanium), but the present disclosure is not limited thereto. The light-emitting layer may include at least one undoped semiconductor layer or at least one lightly doped layer. For example, the light-emitting layer may be a multiple quantum well (MQW) layer.

Referring to FIG. 1, the reflective layer 104, the black layer 106, the plurality of reflective banks 108, and the plurality of black banks 110 are sequentially formed on the substrate 100. In some embodiments, the reflective layer 104 and the black layer 106 are coated onto the surface of the substrate 100, followed by an etching back process to expose the plurality of micro light-emitting diodes 102. From top view, the plurality of reflective banks 108 and the plurality of black banks 110 are patterned-grid structures, in order to compartmentalize each of the plurality of micro light-emitting diodes 102. The color-conversion materials 112 may be disposed above at least one of the plurality of micro light-emitting diodes 102, and fills the space laterally between the plurality of reflective banks 108. The manufacturing process of the reflective layer 104, the black layer 106, the plurality of reflective banks 108, the plurality of black banks 110, and the color-conversion materials 112 will be described in detail in reference with FIGS. 2A-2H.

According to some embodiments of the present disclosure, the reflective layer 104 is formed on the substrate 100. The reflective layer 104 may reflect lights emitted from the plurality of micro light-emitting diodes 102. Since the lights emitted from the light-emitting layer are irradiated in all directions, the reflective layer 104 surrounds the plurality of micro light-emitting diodes 102 in order to reflect as much emitted light as possible toward the display direction A, so the light efficiency and the brightness may be increased. When the black layer 106 is not present thereon, the reflective layer 104 may also reflect the ambient light inadvertently. The presence of the black layer 106 may suppress unwanted ambient light from reflecting. Materials of the reflective layer 104 may include organic layer (photo-resistant, epoxy, the like, or combinations thereof) with titanium dioxide ($TiO_2$), zirconium dioxide ($ZrO_2$), or other reflective nanoparticles. The thickness of the reflective layer 104 may be approximately between 4.0 μm and 6.0 μm. The reflective layer 104 may be formed by spin-on coating or other suitable process.

The black layer 106 may be formed on the reflective layer 104. According to some embodiments of the present disclosure, the black layer 106 may absorb the ambient light, in order to suppress ambient light reflection. Materials of the black layer 106 may include acrylic resin (polymeric) photoresist material with black pigment or dye, the like, or combinations thereof. The thickness of the black layer 106 may be approximately between 1.0 μm and 2.0 μm. The formation of the black layer 106 may be similar to that of the reflective layer 104, and the details are not described again herein to avoid repetition. In the present embodiment, the surface of the black layer 106 may be coplanar with the top surface of the plurality of micro light-emitting diodes 102.

The plurality of reflective banks 108 are disposed on the surface of the black layer 106, and not on the top surface of the plurality of micro light-emitting diodes 102. When the light rays are emitted from the top surface of the plurality of micro light-emitting diodes 102, the plurality of reflective banks 108 may function as a light pipe structure to reflect the light rays toward the plurality of color filter units 116 located above. Additionally, the plurality of reflective banks 108 may allow the color-conversion materials 112 to be filled in between. In other words, when the light rays are transmitted toward the plurality of color filter units 116, the plurality of reflective banks 108 may isolate the light rays within the sub-pixel region therebetween to prevent interference between adjacent sub-pixel regions (causing color crosstalk, resulting in inaccurate pixel color, and affecting the displayed quality). Materials of the plurality of reflective banks 108 are similar to those of the reflective layer 104, and the details are not described again herein to avoid repetition. The thickness of the plurality of reflective banks 108 may be approximately between 5.0 μm and 15.0 μm. It should be appreciated that in the display direction A, the sum of the thickness of the reflective banks 108 and the thickness of the black banks 110 disposed above is larger than the sum of the thickness of the underlying black layer 106 and the thickness of the reflective layer 104 disposed below. When the color-conversion materials 112 are laterally disposed between the plurality of reflective banks 108, the plurality of reflective banks 108 may fully encompass the color-conversion materials 112. The formation of the plurality of reflective banks 108 may include any suitable deposition and patterning processes.

The plurality of black banks 110 may be disposed on the plurality of reflective banks 108. When the ambient light enters the display device 10, the plurality of black banks 110 may prevent the ambient light to contact and reflect on the plurality of reflective banks 108. As mentioned previously, the placement of the plurality of black banks 110 suppresses the ambient light reflection from the plurality of reflective banks 108. Materials of the plurality of black banks 110 are similar to those of the black layer 106, and the details are not described again herein to avoid repetition. The thickness of the plurality of black banks 110 may be approximately between 1.0 µm and 2.0 µm. The formation of the plurality of black banks 110 may be similar to that of the plurality of reflective banks 108, and the details are not described again herein to avoid repetition.

Referring to FIG. 1, the top width of the plurality of reflective banks 108 is substantially equal to the bottom width of the plurality of black banks 110. The plurality of reflective banks 108 and the plurality of black banks 110 laterally surround and expose each of the plurality of micro light-emitting diodes 102. As stated earlier, the plurality of reflective banks 108 may function as a light pipe structure to reflect the light toward the plurality of color filter units 116 located above, and the plurality of black banks 110 may suppress ambient light reflection. In other words, the plurality of reflective banks 108 and the plurality of black banks 110 constitute a partition wall that prevent emitted light of adjacent micro light-emitting diodes 102 from interfering with each other. The configuration of the reflective layer 104, the black layer 106, the plurality of reflective banks 108, and the plurality of black banks 110 may suppress the ambient light reflection and improve the contrast ratio and/or the blackness simultaneously, so a resulting image of higher quality may be displayed.

In some embodiments, the color-conversion materials 112 are disposed on at least one of the plurality of micro light-emitting diodes 102 and a portion of the black layer 106, and corresponding to the respective color filter units 116. More specifically, the color-conversion materials 112 are located between at least one of the plurality of micro light-emitting diodes 102 and at least one of the plurality of color filter units 116 in the display direction A. In some embodiments, the color-conversion materials 112 may be colored red, green, blue, or colors of other wavelength. In the present embodiment, the color-conversion materials 112 include the red color-conversion material 112-1 and the green color-conversion material 112-2. According to some embodiments of the present disclosure, the color-conversion materials 112 may change the wavelength of incident light rays (from the plurality of micro light-emitting diodes 102). In some embodiments, the red light has a wavelength between 605 nm to 650 nm, the green light has a wavelength between 500 nm to 550 nm, and the blue light has a wavelength between 400 nm to 460 nm.

For example, the red color-conversion material 112-1 and the green color-conversion material 112-2 may absorb the emitted blue light and change its wavelength into that of the red light and the green light, respectively. Materials of the color-conversion materials 112 may include CdSe, CdS, CdTe, ZnO, InP, $CsPbX_3$ (perovskite quantum dots), KSF/β-SiAlON (phosphor materials) the like, or combinations thereof. The thickness of the color-conversion materials 112 may be equal to or less than the thickness of the plurality of reflective banks 108. In other words, the color-conversion materials 112 are formed within at least one of the areas defined by the plurality of reflective banks 108. The color-conversion materials 112 may be formed in sequence by a coating, exposure, and development process at different steps. Alternatively, the color-conversion materials 112 may be formed by ink-jet printing.

Referring to FIG. 1, the optical layer 122 is formed on the intermediate structure of the display device 10. The optical layer 122 may cover the substrate 100, the plurality of micro light-emitting diodes 102, the reflective layer 104, the black layer 106, the plurality of reflective banks 108, the plurality of black banks 110, and the color-conversion materials 112. According to some embodiments of the present disclosure, the optical layer 122 may provide structural support and maintain the space between the substrate 100 and the subsequently formed cover plate 120. As shown in FIG. 1, the optical layer 122 is vertically interposed between the plurality of micro light-emitting diodes 102 and the plurality of color filter units 116. The optical layer 122 may have a thickness T between the substrate 100 and the cover plate 120 in the display direction A. The thickness T of the optical layer 122 may be approximately between 15 µm and 100 µm, and the thickness T between 20 µm and 50 µm is preferred for display quality. The optical layer 122 may be formed by spin-on coating, chemical vapor deposition (CVD), physical vapor deposition (PVD), high-density plasma chemical vapor deposition (HDP-CVD), plasma-enhanced chemical vapor deposition (PECVD), flowable chemical vapor deposition (FCVD), sub-atmospheric chemical vapor deposition (SACVD), sputtering, the like, or combinations thereof.

The cover plate 120 may function as a base structure for the plurality of light-shielding structures 114 and the plurality of color filter units 116 to be formed thereon, and may also provide mechanical protection toward the underlying structure. In other words, the plurality of light-shielding structures 114 and the plurality of color filter units 116 are arranged on the cover plate 120, and the cover plate 120 is flipped upside down and adhered to the substrate 100 through the optical layer 122. It means that, the plurality of color filter units 116 are disposed between the cover plate 120 and the substrate 100. In the present embodiment, the red color filter unit 116-1, the green color filter unit 116-2, and the blue color filter unit 116-3 are placed in correspondence with the red color-conversion material 112-1, the green color-conversion material 112-2, and the blue micro light-emitting diodes 102A. The cover plate 120 may be formed of, for example, a light-transmissive insulation material, such as glass or transparent resins. Exemplary transparent resins include polyethylene terephthalate (PET) resins, polycarbonate (PC) resins, polyimide (PI) resins, polymethylmethacrylates (PMMA), the like, or combinations thereof. The thickness of the cover plate 120 may be approximately between 200 µm and 600 µm. In some embodiments, the cover plate 120 may be formed by any of the deposition methods described above, and the details are not described again herein to avoid repetition.

The plurality of light-shielding structures 114 are disposed on the cover plate 120. In some embodiments, the plurality of light-shielding structures 114 are arranged to prevent the light rays transmitting through adjacent color filter units 116 from interfering with each other, which may affect the quality of the displayed image. Materials of the plurality of light-shielding structures 114 may include acrylic resin (polymeric) photo-resist material with black pigment or dye, the like, or combinations thereof. The thickness of the plurality of light-shielding structures 114 may be approximately between 1 μm and 2 μm. The plurality of light-shielding structures 114 may be formed by depositing a black material layer on the cover plate 120 and then patterning the black material layer using photolithography and etching processes, but the present disclosure is not limited thereto.

The plurality of color filter units 116 are disposed on the cover plate 120, and are laterally separated by the plurality of light-shielding structures 114. In the present embodiment, as stated earlier, the plurality of color filter units 116 may include the red color filter unit 116-1, the green color filter unit 116-2, and the blue color filter unit 116-3. The purpose of the plurality of color filter units 116 may further filter the generated lights to ensure the exemplary pixel P may display pure red light, pure green light, and pure blue light. The plurality of color filter units 116 may be formed in sequence by a coating, exposure, and development process at different steps. Alternatively, the plurality of color filter units 116 may be formed by ink-jet printing.

FIGS. 2A-2H are various cross-sectional views of intermediate stages in manufacturing the display device 10, according to some embodiments of the present disclosure. It should be appreciated that the plurality of light-shielding structures 114, the plurality of color filter units 116, the cover plate 120, and the optical layer 122 are omitted for simplicity. The illustration of FIGS. 2A-2H will emphasize the formation of the reflective layer 104, the black layer 106, the plurality of reflective banks 108, and the plurality of black banks 110.

Figure 2A:
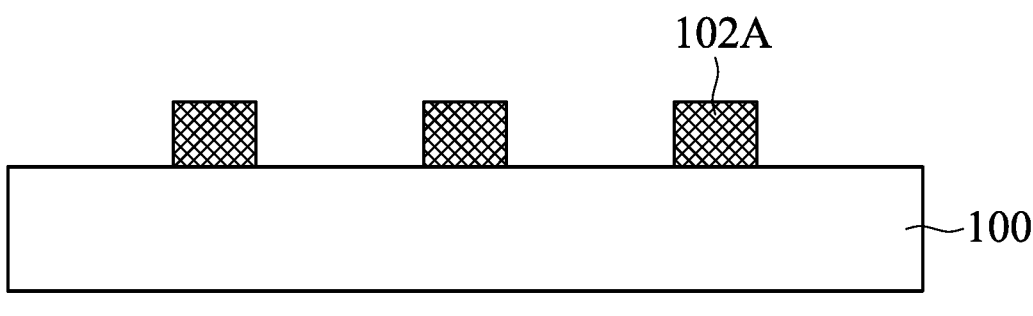
FIGS. 2A-2H are various cross-sectional views of intermediate stages in manufacturing the display device, according to some embodiments of the present disclosure.
Figure 2B:
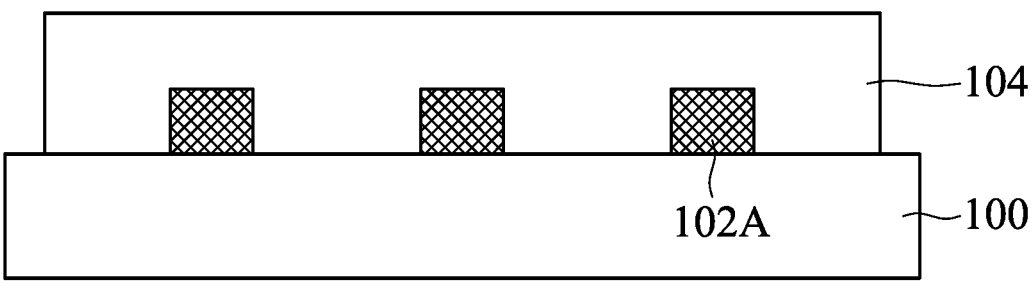
Figures 2C, 2D:
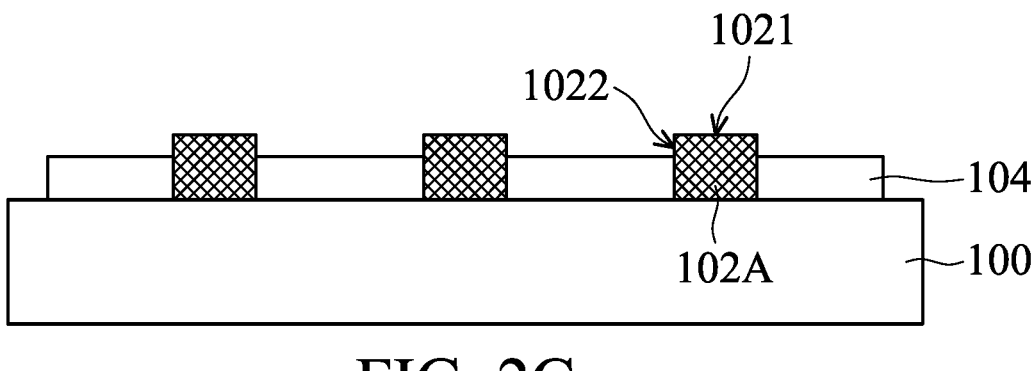
Figure 2E:
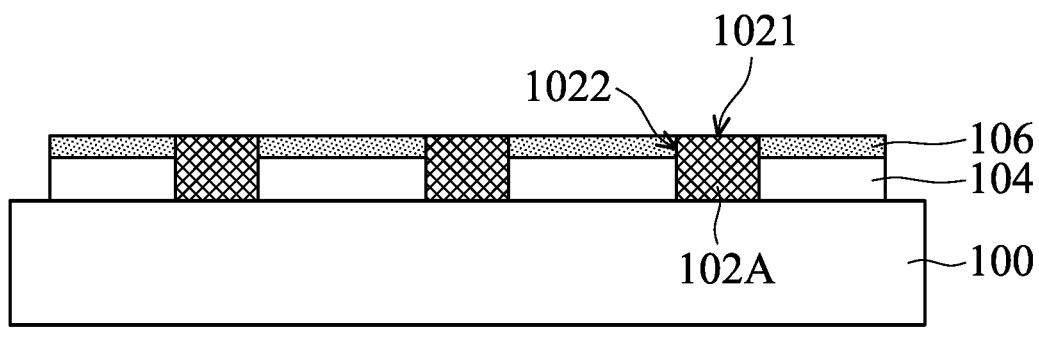

Initially, the substrate 100 is provided with the plurality of micro light-emitting diodes 102 formed thereon, and the plurality of micro light-emitting diodes 102 may be bonded onto the substrate 100 using mass transfer process (to transfer and bond a few thousands to hundreds of thousands micro light-emitting diodes at a time), as shown in FIG. 2A. The reflective layer 104 is over-coated on the substrate 100 to cover the plurality of micro light-emitting diodes 102, as shown in FIG. 2B. Next, the over-coated reflective layer 104 is etched back until a top surface 1021 and a portion of a sidewall 1022 of the plurality of micro light-emitting diodes 102 protrude above the reflective layer 104. In other words, the reflective layer 104 may be lower than the plurality of micro light-emitting diodes 102, as shown in FIG. 2C. The black layer 106 is then formed conformally on the plurality of micro light-emitting diodes 102 and the reflective layer 104, as shown in FIG. 2D. After that, the black layer 106 is etched back to expose the top surface 1021 of the plurality of micro light-emitting diodes 102. It is preferred that the surface of the black layer 106 is coplanar with the top surface 1021 of the plurality of micro light-emitting diodes 102, as shown in FIG. 2E. It should be noted that, at this stage, the top surface 1021 of the plurality of micro light-emitting diodes 102 are uncovered by the reflective layer 104 and the black layer 106.

Figure 2F:
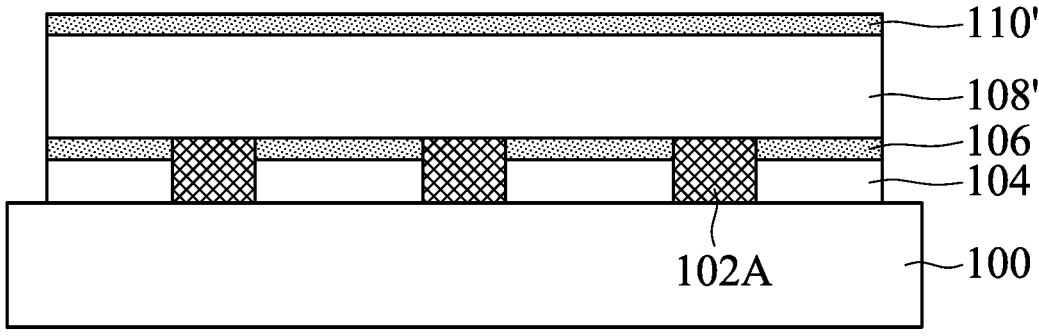
Figure 2G:
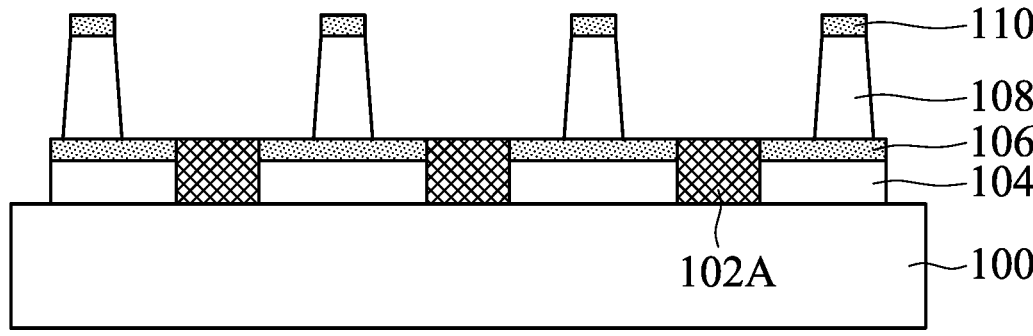
Figure 2H:
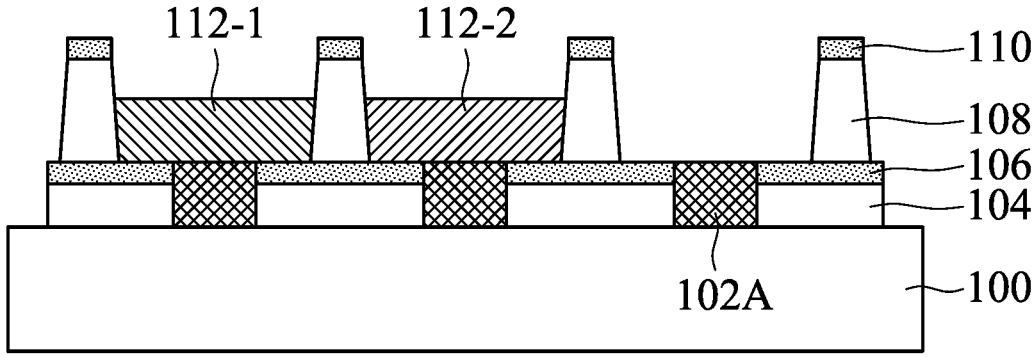

After that, a second reflective layer 108' and a second black layer 110' are sequentially formed on the plurality of micro light-emitting diodes 102 and the black layer 106, as shown in FIG. 2F. Next, the second reflective layer 108' and the second black layer 110' are respectively patterned into the plurality of reflective banks 108 and the plurality of black banks 110 through lithography and etching processes, forming multiple accommodating spaces and exposing the top surface 1021 of the micro light-emitting diodes 102 and a portion of the black layer 106, as shown in FIG. 2G. Then, the red color-conversion material 112-1 and the green color-conversion material 112-2 are filled into the accommodating spaces to be disposed above two of the plurality of micro light-emitting diodes 102 (or the blue micro light-emitting diodes 102A) and laterally between the plurality of reflective banks 108, as shown in FIG. 2H.

Figure 3A:
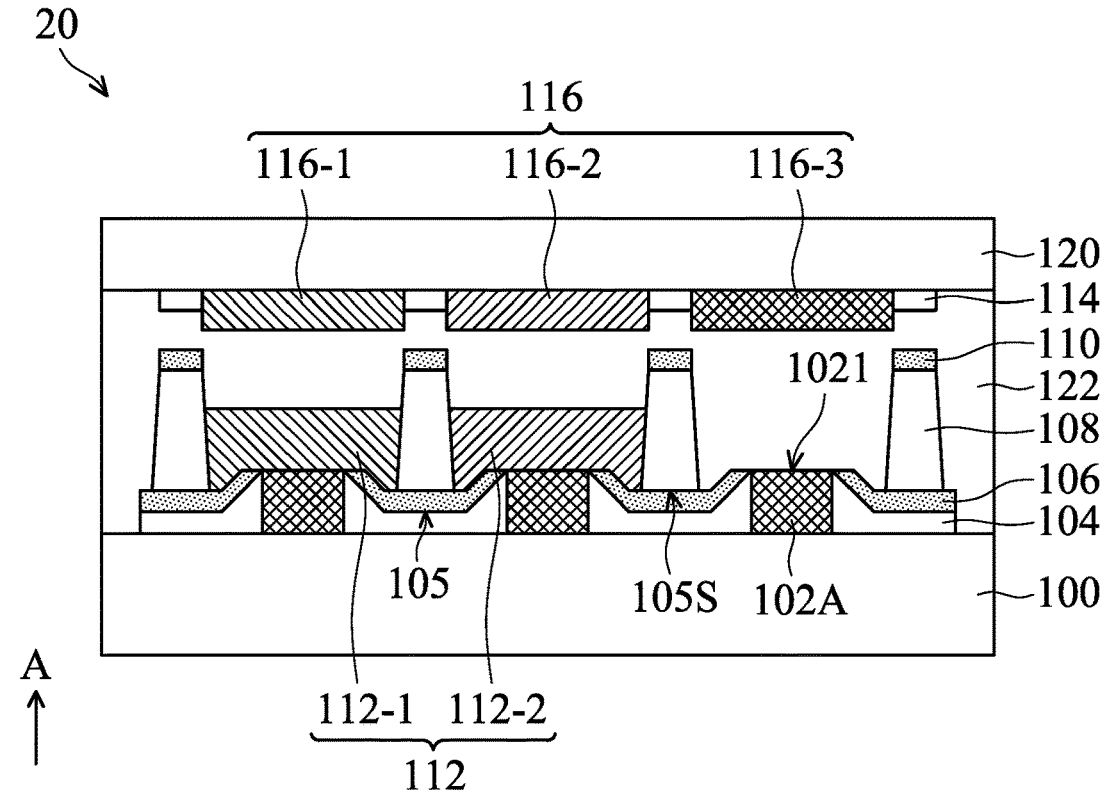
FIGS. 3A and 3B are cross-sectional views of display devices, according to other embodiments of the present disclosure.
Figure 3B:
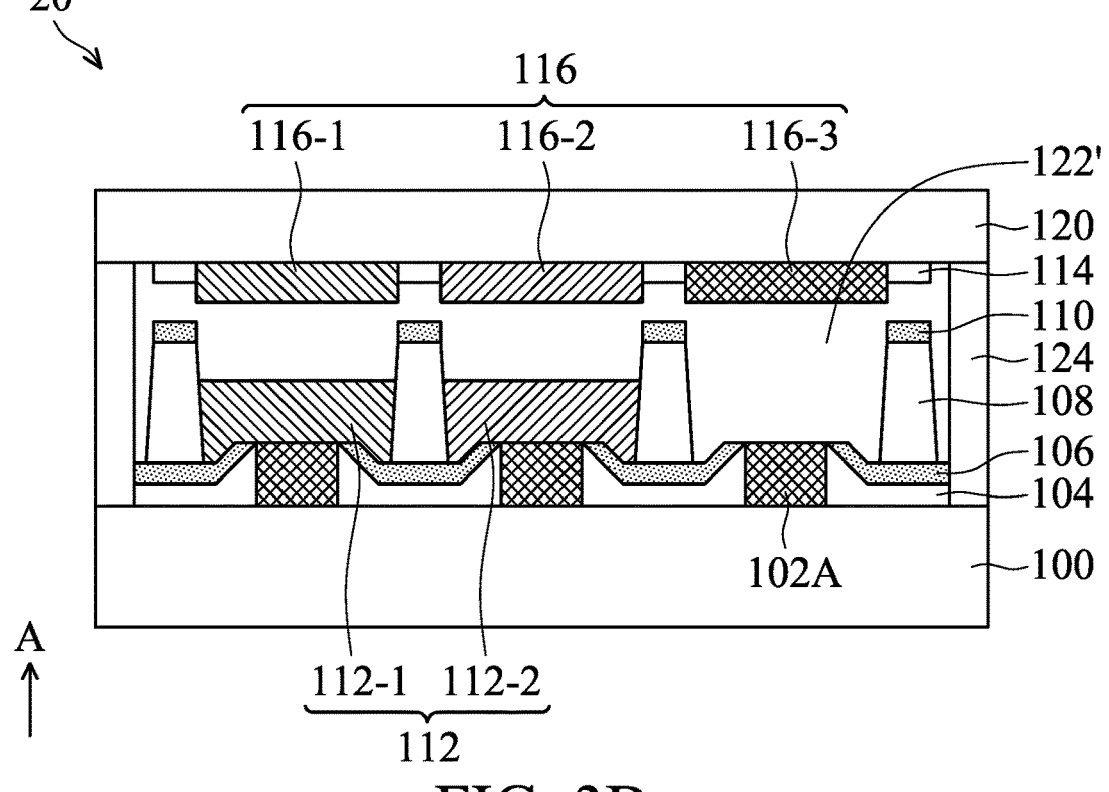

FIGS. 3A and 3B are cross-sectional views of display devices 20 and 20', according to other embodiments of the present disclosure. The display device 20 of FIG. 3A illustrates an alternative design. In comparison with the display device 10 of FIG. 1, the reflective layer 104 of the display device 20 includes concave portions 105 located between the plurality of micro light-emitting diodes 102. The features of the substrate 100, the plurality of micro light-emitting diodes 102 (for example, the blue micro light-emitting diodes 102A), the reflective layer 104, the black layer 106, the plurality of reflective banks 108, the plurality of black banks 110, the color-conversion materials 112 (including the red color-conversion material 112-1 and the green color-conversion material 112-2), the plurality of light-shielding structures 114, the plurality of color filter units 116 (including the red color filter unit 116-1, the green color filter unit 116-2, and the blue color filter unit 116-3), the cover plate 120, and the optical layer 122 are similar to those illustrated in FIG. 1, and the details are not described again herein to avoid repetition.

Referring to FIG. 3A, the reflective layer 104 is etched back for a longer period of time to form the concave portions 105. The subsequently deposited black layer 106 may adopt the same topology of the reflective layer 104, so the black layer 106 may have a concave surface 105S. The concave surface 105S of the concave portions 105 is lower than the top surface 1021 of the plurality of micro light-emitting diodes 102, and the plurality of reflective banks 108 sit on the concave portions 105. In the presence of the concave portions 105, the concave profile of the black layer 106 may absorb lights emitted from the plurality of micro light-emitting diodes 102 in lateral directions and absorb the ambient light reflection to further increase the contrast ratio, in which the displayed image quality may be further enhanced.

Referring to FIG. 3B, the display device 20' further includes a sealant layer 124, where an optical layer 122' is confined by the sealant layer 124 and fills in the space between the substrate 100 and the cover plate 120. In the present embodiments, the sealant layer 124 surrounds the array of exemplary pixels P when viewed from top to adhere the cover plate 120 and the substrate 100, and the optical layer 122' is interposed between the plurality of micro light-emitting diodes 102 and the plurality of color filter units 116. Materials of the optical layer 122' are similar to those of the optical layer 122, and the details are not described again herein to avoid repetition. The lateral width of the sealant layer 124 may be approximately between 200 μm and 8 mm. In comparison with the display device 20 of FIG. 3A, the display device 20' with the sealant layer 124 surrounding the perimeter of the space (when viewed from top) may exhibit stronger adhesion and structural support than the display device 20 with only the optical layer 122.

Figure 4:
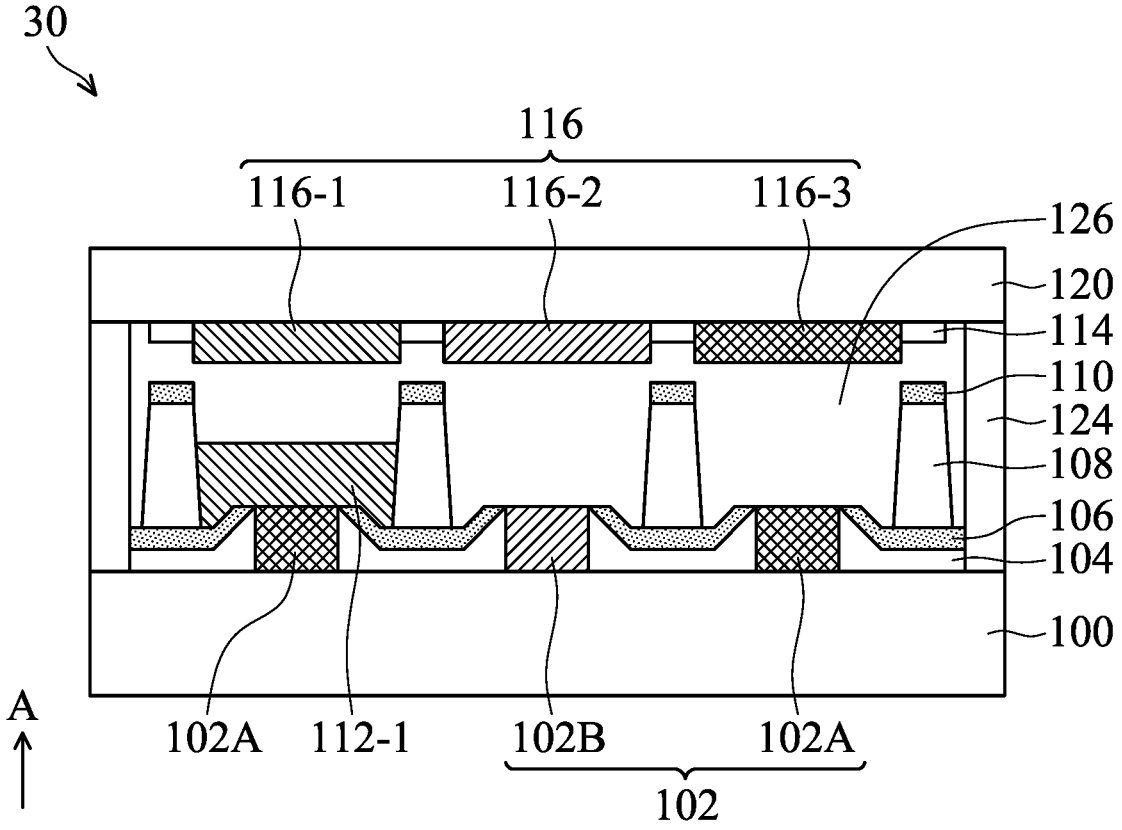
FIG. 4 is a cross-sectional view of a display device, according to yet other embodiments of the present disclosure.

FIG. 4 is a cross-sectional view of a display device 30, according to yet other embodiments of the present disclosure. In comparison with the display device 20' of FIG. 3B, the display device 30 includes an air gap 126, one more type of the plurality of micro light-emitting diodes 102, and one less type of the color-conversion materials 112. The features of the substrate 100, the plurality of micro light-emitting diodes 102, the reflective layer 104, the black layer 106, the plurality of reflective banks 108, the plurality of black banks 110, the color-conversion materials 112, the plurality of light-shielding structures 114, the plurality of color filter units 116 (including the red color filter unit 116-1, the green color filter unit 116-2, and the blue color filter unit 116-3), the cover plate 120, and the sealant layer 124 are similar to those illustrated in FIG. 3B, and the details are not described again herein to avoid repetition.

Referring to FIG. 4, the air gap 126, instead of the optical layer 122', is interposed between the plurality of micro light-emitting diodes 102 and the plurality of color filter units 116. It should be noted that, the refractive index of air is lower than the refractive index of the material of the optical layer 122 or 122'. Since there will be less refraction within the space, the resulting image may appear to be brighter. However, the display device 20' with the optical layer 122' filling up the space may exhibit stronger integrity and higher reliability than the display device 30.

The refractive index is a characteristic of a substance that changes the speed of light, and is a value obtained by dividing the speed of light in vacuum by the speed of light in the substance. When light travels between two different materials at an angle, its refractive index determines the angle of light transmission (refraction). Therefore, the light rays transmitted through the materials of the optical layer 122 or 122' will be refracted from the light rays transmitted through the air gap 126, thus the displayed image may be affected.

Referring to FIG. 4, the display device 30 includes a green micro light-emitting diode 102B of the plurality of micro light-emitting diodes 102, which replaces the green color-conversion material 112-2 of the color-conversion materials 112. The green micro light-emitting diode 102B may emit green light, so the color-conversion materials 112 is not required to convert the emitted light's wavelength. The light of each sub-pixel region may be generated from the red color-conversion material 112-1, the green micro light-emitting diode 102B, and the blue micro light-emitting diode 102A, respectively. It should be understood that a red micro light-emitting diode is rarely used, thus embodiments of which are not introduced herein. Depending on the design or application requirement, the number of types of micro light-emitting diodes 102 and the number of types of color-conversion materials 112 may be selected accordingly, as long as the display function may be properly realized.

Figure 5A:
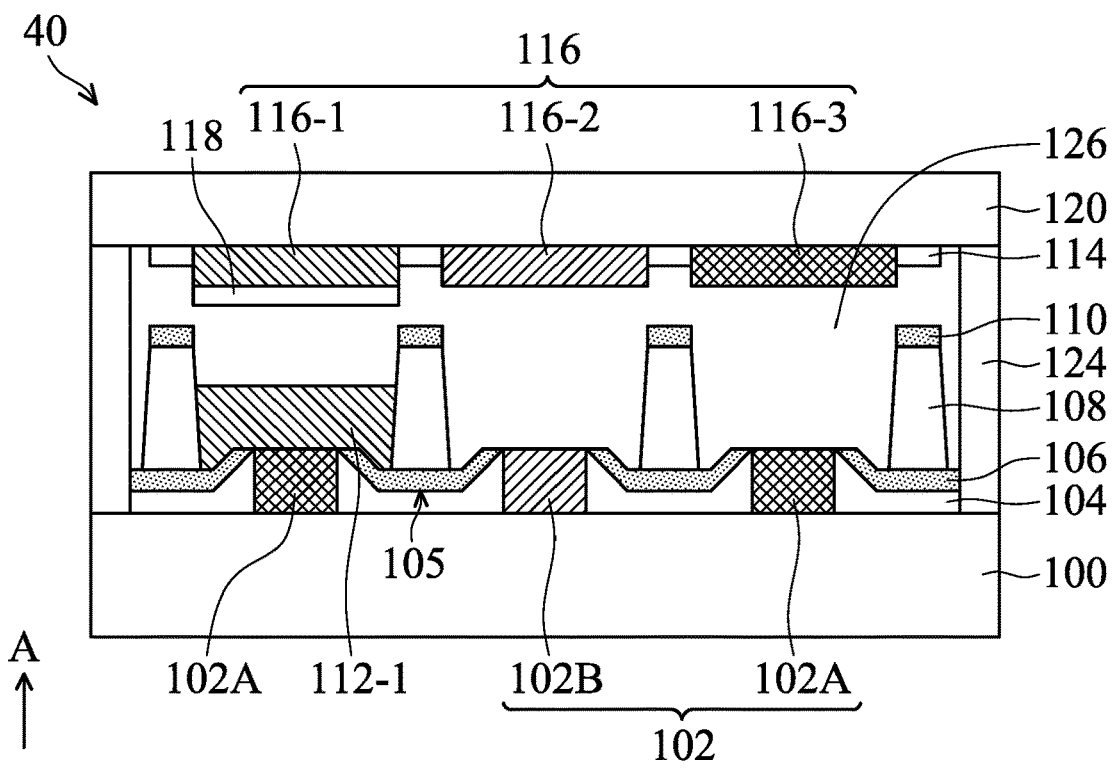
FIGS. 5A and 5B are cross-sectional views of display devices, according to other embodiments of the present disclosure.
Figure 5B:
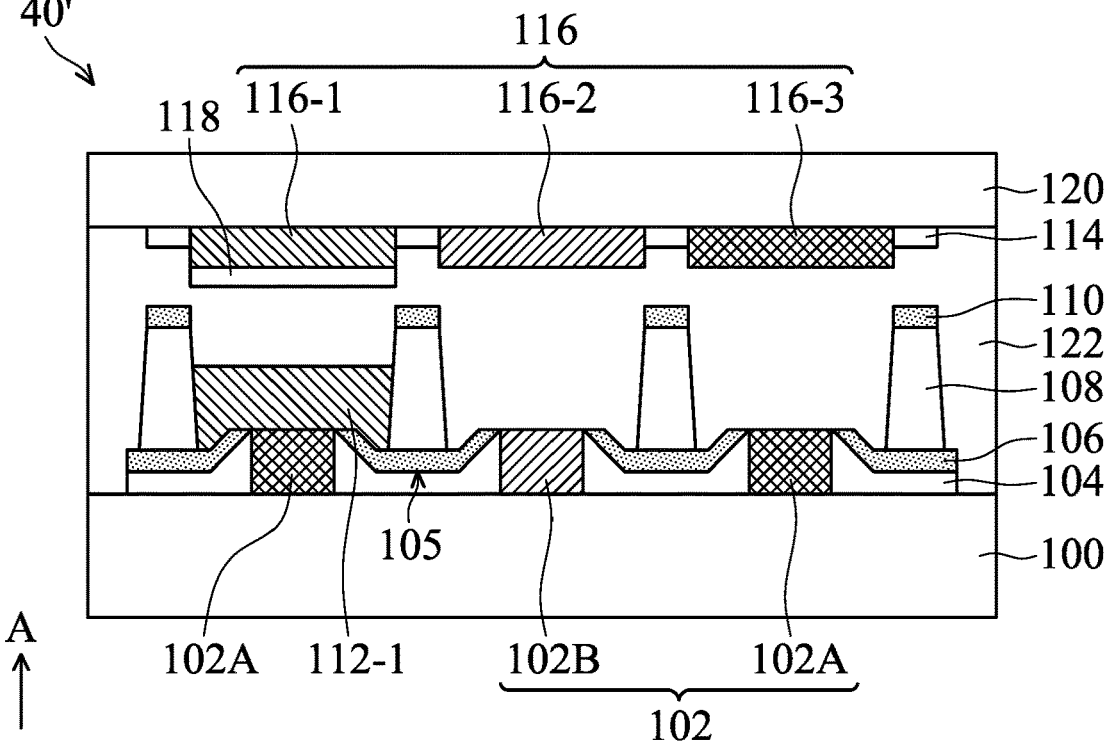

FIGS. 5A and 5B are cross-sectional views of display devices 40 and 40', according to other embodiments of the present disclosure. In comparison with the display device 30 of FIG. 4, the display device 40 includes a photon recycling layer 118 formed onto one of the plurality of color filter units 116. The features of the substrate 100, the plurality of micro light-emitting diodes 102 (including the blue micro light-emitting diode 102A and the green micro light-emitting diode 102B), the reflective layer 104, the black layer 106, the plurality of reflective banks 108, the plurality of black banks 110, the color-conversion materials 112 (for example, the red color-conversion material 112-1), the plurality of light-shielding structures 114, the plurality of color filter units 116 (including the red color filter unit 116-1, the green color filter unit 116-2, and the blue color filter unit 116-3), the cover plate 120, the sealant layer 124, and the air gap 126 are similar to those illustrated in FIG. 4, and the details are not described again herein to avoid repetition.

Referring to FIG. 5A, when the blue light emitting from the blue micro light-emitting diode 102A is being transmitted through the red color-conversion material 112-1, the red color-conversion material 112-1 may not completely convert emitted light's original wavelength into the desired wavelength. For the blue light that is not converted into the red light, the photon recycling layer 118 of the display device 40 may reflect the unconverted blue light back to the red color-conversion material 112-1, instead of allowing the unconverted blue light being absorbed then filtered off by the red color filter unit 116-1. For this embodiment, the photon recycling layer 118 may also be referred to as a blue photon recycling layer. It should also be appreciated that the photon recycling layer 118 is placed to correspond to the color-conversion material 112.

The photon recycling layer 118 (or the blue photon recycling layer) is characterized with high reflection for the blue light and high transmission for the red/green light. Instead of being simply filtered off by the red color filter unit 116-1, the unconverted blue light may be reflected back to the red color-conversion material 112-1 for another attempt of conversion. If successfully converted, the converted red light can then be transmitted through the red color filter unit 116-1. Therefore, implementing the photon recycling layer 118 may improve the color-conversion efficiency of the display device 40. The photon recycling layer 118 may be a distributed Bragg reflector (DBR), a patterned Cholesteric liquid crystal (P-CLC), and a blue anti-transmission film (BATF). The distributed Bragg reflector is a structure formed from multiple layers of alternating materials with varying refractive index, resulting in periodic variation in the effective refractive index in a dielectric waveguide. The patterned cholesteric liquid crystal may create arbitrarily patterned circular polarized optical devices. The blue anti-transmission film may improve the color-conversion efficiency and the stability of color-conversion materials.

Referring to FIG. 5B, the display device 40' includes the optical layer 122 between the substrate 100 and the cover plate 120. While the sealant layer 124 of the display device 40 only partially fills the space between the substrate 100 and the cover plate 120 with the air gap 126 generated in the confined space, the optical layer 122 of the display device 40' completely fills the space between the substrate 100 and the cover plate 120. Similar to the display device 20 of FIG. 3A, the optical layer 122 may exhibit stronger integrity and higher reliability than the display device 40 with the sealant layer 124 disposed only along the perimeter of the space from top view. However, the display device 40 with the air gap 126 confined in the space may result in brighter image than the display device 40' with the optical layer 122 filling the space.

Figure 6A:
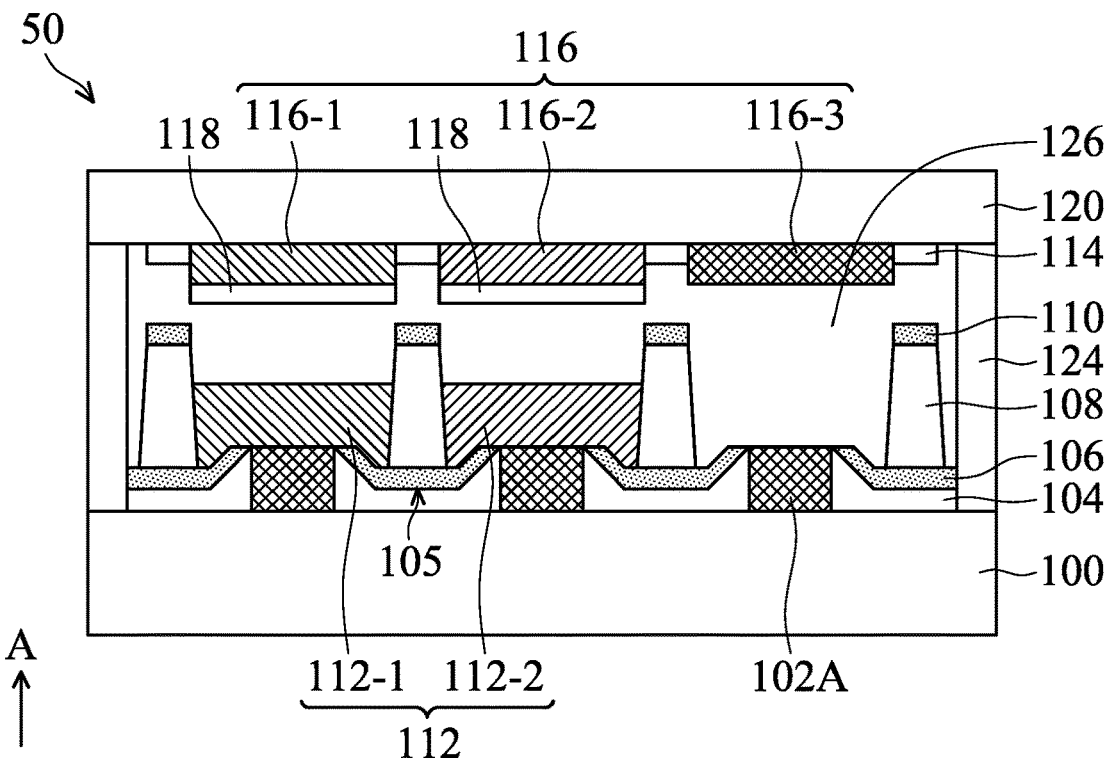
FIGS. 6A and 6B are cross-sectional views of display devices, according to yet other embodiments of the present disclosure.
Figure 6B:
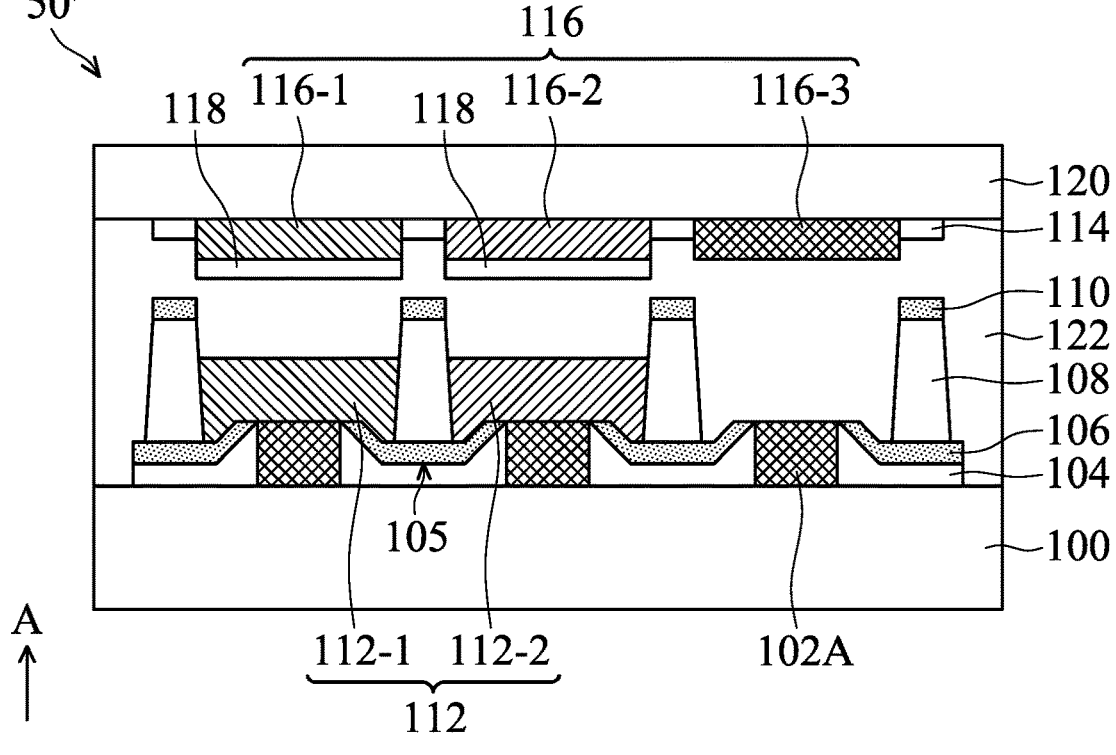

FIGS. 6A and 6B are cross-sectional views of display devices 50 and 50', according to yet other embodiments of the present disclosure. In comparison with FIG. 5A, the display device 50 includes the photon recycling layer 118 formed on more than one of the plurality of color filter units 116. The features of the substrate 100, the plurality of micro light-emitting diodes 102 (for example, the blue micro light-emitting diode 102A), the reflective layer 104, the black layer 106, the plurality of reflective banks 108, the plurality of black banks 110, the color-conversion materials 112 (including the red color-conversion material 112-1 and the green color-conversion material 112-2), the plurality of light-shielding structures 114, the plurality of color filter units 116 (including the red color filter unit 116-1, the green color filter unit 116-2, and the blue color filter unit 116-3), the photon recycling layer 118, the cover plate 120, the sealant layer 124, and the air gap 126 are similar to those illustrated in FIG. 5A, and the details are not described again herein to avoid repetition.

Referring to FIG. 6A, the photon recycling layer 118 is formed on the red color filter unit 116-1 and the green color filter unit 116-2. Since the display device 50 includes only the blue micro light-emitting diode 102A with the red color-conversion material 112-1 and the green color-conversion material 112-2, the photon recycling layer 118 should be placed to correspond to both the red color-conversion material 112-1 and the green color-conversion material 112-2. In some embodiments, when the blue light emitted from the blue micro light-emitting diode 102A is not completely converted to the red light through the red color-conversion material 112-1 and to the green light through the green color-conversion material 112-2, the photon recycling layer 118 may allow the converted red light and the converted green light to transmit through, and reflect the unconverted blue light back to the red color-conversion material 112-1 and the green color-conversion material 112-2. As explained previously, implementing the photon recycling layer 118 may improve the color-conversion efficiency of the display device 50.

Referring to FIG. 6B, the optical layer 122 of the display device 50' completely fills the space between the substrate 100 and the cover plate 120. Similar to the display device 40' of FIG. 5B, the optical layer 122 may exhibit stronger integrity and higher reliability than the display device 50 with the sealant layer 124 disposed only along the perimeter of the space from top view. However, the display device 50 with the air gap 126 confined in the space may result in brighter image than the display device 50' with the optical layer 122 filling the space.

The present disclosure replaces the conventional reflective layer with the reflective layer 104 and the black layer 106, and replaces the conventional plurality of black banks with the plurality of reflective banks 108 and the plurality of black banks 110. The refined structure of the display devices may help suppress the ambient light reflection and improves the contrast ratio and/or the blackness, thus an image of higher quality may be displayed. In addition, the present disclosure also illustrates the concave portions 105 within the reflective layer 104, different types of micro light-emitting diodes 102 or different types of color-conversion materials 112, and the photon recycling layer 118 on at least one of the plurality of color filter units 116 to correspond to the color-conversion materials 112. Depending on the design or application requirements, any of the aforementioned features may be selected to produce the display device of superior performance.

The foregoing outlines features of several embodiments so that those skilled in the art will better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. Therefore, the scope of protection should be determined through the claims. In addition, although some embodiments of the present disclosure are disclosed above, they are not intended to limit the scope of the present disclosure.

Reference throughout this specification to features, advantages, or similar language does not imply that all of the features and advantages that may be realized with the present disclosure should be or are in any single embodiment of the disclosure. Rather, language referring to the features and advantages is understood to mean that a specific feature, advantage, or characteristic described in connection with an embodiment is included in at least one embodiment of the present disclosure. Thus, discussions of the features and advantages, and similar language, throughout this specification may, but do not necessarily, refer to the same embodiment.

Furthermore, the described features, advantages, and characteristics of the disclosure may be combined in any suitable manner in one or more embodiments. One skilled in the prior art will recognize, in light of the description herein, that the disclosure can be practiced without one or more of the specific features or advantages of a particular embodiment. In other instances, additional features and advantages may be recognized in certain embodiments that may not be present in all embodiments of the disclosure.

What is claimed is:

1. A method forming a micro LED display device, comprising:
   providing a substrate;
   bonding a plurality of micro light-emitting diodes on the substrate by a mass transfer process;
   forming a first reflective layer on the substrate, wherein the first reflective layer covers the substrate and a sidewall of each micro light-emitting diode;
   forming a first black layer to cover the first reflective layer and the plurality of micro light-emitting diodes;
   etching back the first black layer until a top surface of each micro light-emitting diode is exposed through the first black layer;
   forming a second reflective layer and a second black layer on the plurality of micro light-emitting diodes and the first black layer;
   patterning the second reflective layer and the second black layer into a plurality of reflective banks and a plurality of black banks, respectively; and
   filling a color-conversion material laterally between the plurality of reflective banks, wherein the color-conversion material covers the top surface of at least one of the plurality of micro light-emitting diodes.

2. The method of claim 1, wherein forming the first reflective layer on the substrate comprises:
   coating the first reflective layer on the substrate, and covering the top surface and the sidewall of each of the plurality of micro light-emitting diodes; and
   etching back the first reflective layer to expose the top surface and a portion of the sidewall of each of the plurality of micro light-emitting diodes.

3. The method of claim 1, further comprising:
   providing a cover plate;
   forming a plurality of color filter units on the cover plate;
   aligning the plurality of color filter units with the plurality of micro light-emitting diodes; and
   adhering the cover plate to the substrate.

4. The method of claim 3, further comprising:
   forming a sealant layer on the substrate to form a space between the substrate and the cover plate.

5. The method of claim 3, wherein adhering the cover plate to the substrate further comprising:
   forming an optical layer between the substrate and the cover plate.

6. The method of claim 4, further comprising forming an air gap within the space.

7. The method of claim 4, further comprising forming an optical layer within the space.

8. The method of claim 3, wherein the color-conversion material is formed vertically between at least one of the plurality of micro light-emitting diodes and at least one of the plurality of color filter units.

9. The method of claim 3, further comprising forming a plurality of light-shielding structures on the cover plate.

10. The method of claim 9, wherein the plurality of light-shielding structures laterally separates the plurality of color filter units.

11. The method of claim 9, wherein the plurality of light-shielding structures vertically correspond to the plurality of black banks.

12. The method of claim 3, further comprising forming a photon recycling layer on at least one of the plurality of color filter units to reflect unconverted lights back to the color-conversion material.

13. The method of claim 1, wherein forming the first reflective layer on the substrate comprises:

coating the first reflective layer on the substrate, and covering the top surface and the sidewall of each of the plurality of micro light-emitting diodes;

performing a first etching process to etch back the first reflective layer to expose the top surface of each of the plurality of micro light-emitting diodes; and performing a second etching process to recess the first reflective layer to form concave portions located between the plurality of micro light-emitting diodes.

14. The method of claim 13, wherein the first black layer is conformally deposited on the concave portions to form a concave surface.

15. The method of claim 14, wherein the concave surface is lower than the top surface of the micro light-emitting diode adjacent to the concave portions.

16. The method of claim 13, wherein the plurality of reflective banks are disposed on the concave surface of the concave portions.

17. The method of claim 1, wherein a sum of a thickness of the second reflective layer and a thickness of the second black layer is larger than a sum of a thickness of the first reflective layer and a thickness of the first black layer.

18. The method of claim 1, wherein the first reflective layer, the first black layer, the plurality of reflective banks, and the plurality of black banks overlap each other in a display direction.

* * * * *